US010834352B2

(12) United States Patent
Qin et al.

(10) Patent No.: US 10,834,352 B2
(45) Date of Patent: Nov. 10, 2020

(54) CONFIGURABLE INTERFACE ALIGNMENT BUFFER BETWEEN DRAM AND LOGIC UNIT FOR MULTIPLE-WAFER IMAGE SENSORS

(71) Applicant: OmniVision Technologies, Inc., Santa Clara, CA (US)

(72) Inventors: Qing Qin, Santa Clara, CA (US); Hoon Ryu, Sunnyvale, CA (US); Taehyung Jung, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/247,475

(22) Filed: Jan. 14, 2019

(65) Prior Publication Data

US 2020/0228739 A1    Jul. 16, 2020

(51) Int. Cl.
*H04N 5/378* (2011.01)
*H04N 5/374* (2011.01)
*H04N 5/369* (2011.01)
*H04N 5/3745* (2011.01)
*H01L 27/146* (2006.01)

(52) U.S. Cl.
CPC ....... *H04N 5/378* (2013.01); *H01L 27/14687* (2013.01); *H04N 5/379* (2018.08); *H04N 5/37455* (2013.01); *H01L 27/14643* (2013.01)

(58) Field of Classification Search
CPC .. H04N 5/374; H04N 5/3745; H04N 5/37455; H04N 5/378; H04N 5/3741; H04N 5/3742; H01L 27/14643; H01L 27/14652; H01L 27/14687; H01L 27/14689
See application file for complete search history.

(56) References Cited

U.S. PATENT DOCUMENTS

| 4,941,049 A * | 7/1990 | Citta | H04N 5/211 348/611 |
| 6,870,565 B1 * | 3/2005 | Blerkom | H04N 5/378 348/294 |
| 8,345,117 B2 * | 1/2013 | Wang | H04N 5/345 348/222.1 |

(Continued)

OTHER PUBLICATIONS

Tsugawa et al. (2017) "Pixel/DRAM/logic 3-layer stacked CMOS image sensor technology," Presented at the 63rd IEEE International Electron Devices Meeting (IEDM), 4 pp.

*Primary Examiner* — Ngoc Yen T Vu
(74) *Attorney, Agent, or Firm* — Lathrop GPM LLP

(57) ABSTRACT

An image sensor has an array of pixels configured in multiple blocks; each block coupled to a separate analog-to-digital converter (ADC) to provide digitized image data. The ADCs feed digitized images into an image RAM; and the image RAM feeds digitized images to an alignment buffer in a first pixel order. The alignment buffer provides digitized images to an image processor in a second pixel order different from the first pixel order. In an embodiment, the alignment buffer uses a multiport RAM. In another embodiment, the alignment buffer uses first and second alignment buffer RAMs, writing one alignment buffer RAM while reading the other alignment buffer RAM to provide image data to the image processor. In embodiments, the alignment buffer provides digitized images in an order selectable between a full resolution and a reduced resolution order, and selectable between a right-to-left and left-to-right order.

13 Claims, 7 Drawing Sheets

(56) References Cited

U.S. PATENT DOCUMENTS

| | | | |
|---|---|---|---|
| 8,727,223 B2 * | 5/2014 | Wang | G06K 7/10722 |
| | | | 235/462.11 |
| 9,911,768 B2 * | 3/2018 | Nakamura | H04N 5/372 |
| 10,157,951 B2 * | 12/2018 | Kim | H01L 27/14634 |
| 10,204,954 B2 * | 2/2019 | Asaba | H04N 5/37452 |
| 10,257,426 B2 * | 4/2019 | Lee | H04N 5/379 |

\* cited by examiner

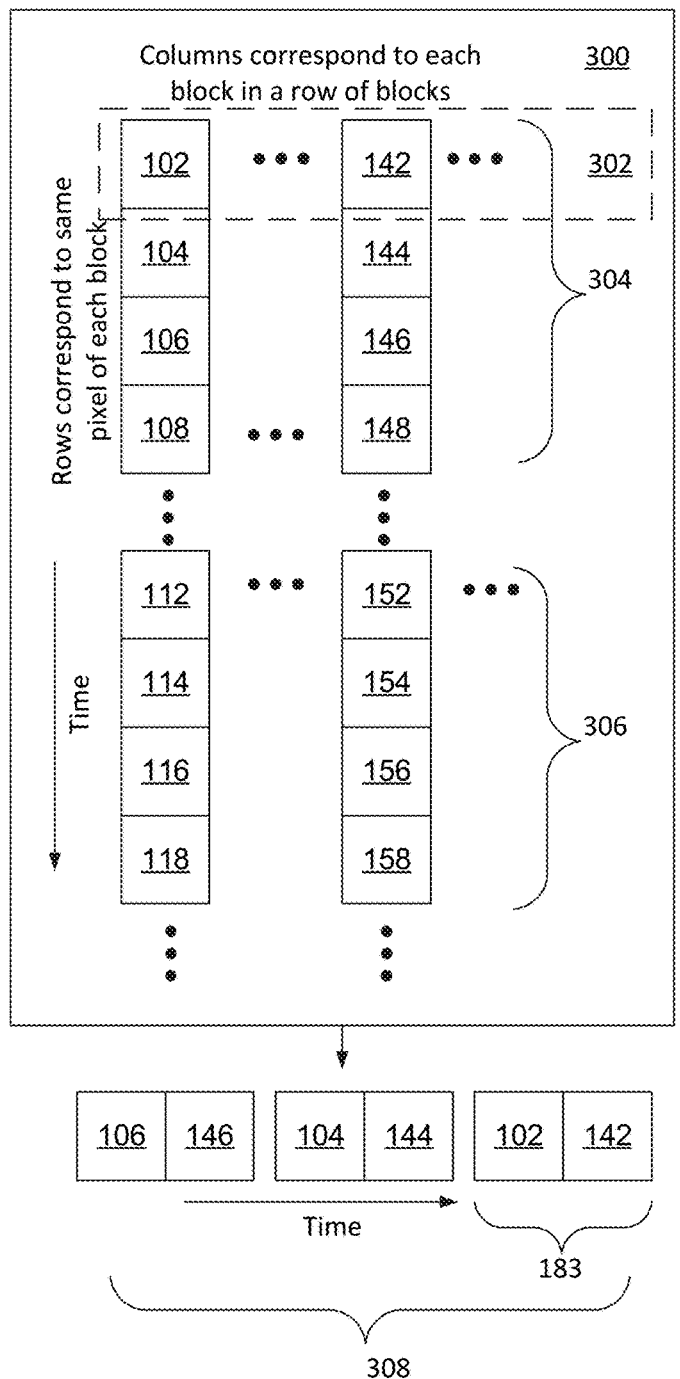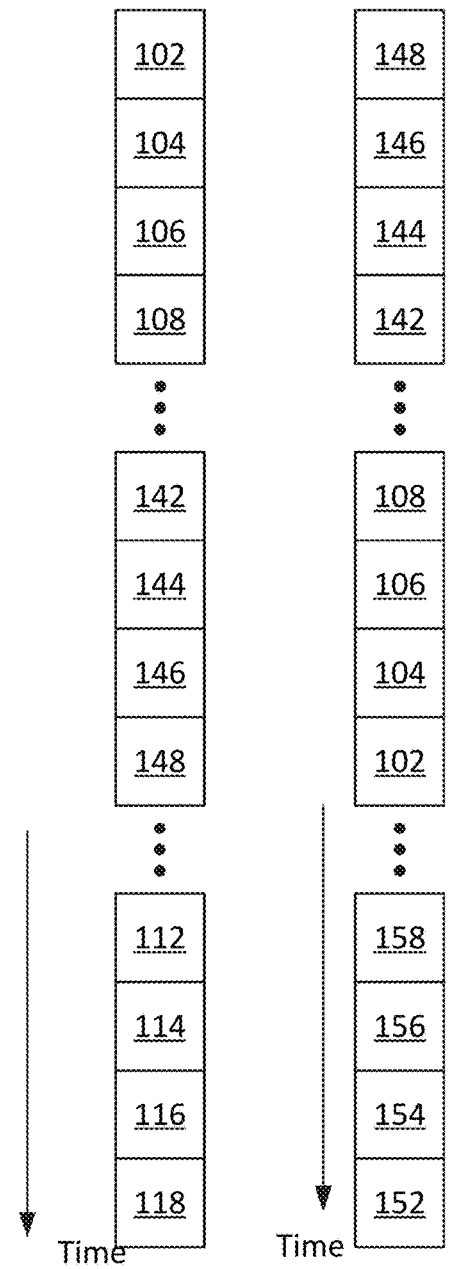
Fig. 3
Fig. 4A  Fig. 4B

US 10,834,352 B2

CONFIGURABLE INTERFACE ALIGNMENT BUFFER BETWEEN DRAM AND LOGIC UNIT FOR MULTIPLE-WAFER IMAGE SENSORS

BACKGROUND

Photosensor arrays may be associated with readout and raw-image storage circuits that provide data in a different order than the physical order of pixels within the array. For example, typically bond-per-pixel-block stacked-wafer image sensor designs have a pixel array die with pixels arranged in groups or pixel blocks, with each group containing 8, 16, 32, or 64 pixels, each pixel of the group being read in sequence through an analog-to-digital converter (ADC) into an image memory (RAM) on at least a second die. When those pixels are read from that memory, they may naturally be in an order having a single pixel from each group adjacent to a corresponding pixel from the next group, with remaining pixels from each group fetched at other times, such as in following image RAM words. This order does not allow physically adjacent pixels to arrive at an image processor together Typical camera functions include autofocus and color-plane processing. A function common to much image processing, and many autofocus methods, is edge detection. Many edge detecting units are configured to receive data in pixel-order sequence, not in an out-of-order sequence.

SUMMARY

An image sensor has an array of pixels configured in multiple blocks; each block coupled to a separate analog-to-digital converter (ADC) to provide digitized image data. The ADCs feed digitized images into an image RAM; and the image RAM feeds digitized images to an alignment buffer in a first pixel order. An alignment buffer provides digitized images to an image processor in a second pixel order different from the first pixel order. In a particular embodiment, the alignment buffer uses a multiport RAM. In another particular embodiment the alignment buffer uses first and second alignment buffer RAMs, writing the first alignment buffer RAM while reading the second alignment buffer RAM to provide image data to the image processor, and vice-versa. In yet another embodiment, the alignment buffer is divided into sub-buffers each operating over a width of 128 pixels.

BRIEF DESCRIPTION OF THE FIGURES

FIG. 3 is an illustration of how data from blocks 103, 140 of the pixel array of FIG. 2 are written into the RAM image buffer of FIG. 2.

FIGS. 4A and 4B illustrate left-to right or right-to-left re-ordered data sequences adapted for input to the image processor.

DETAILED DESCRIPTION OF THE EMBODIMENTS

Figure 1:
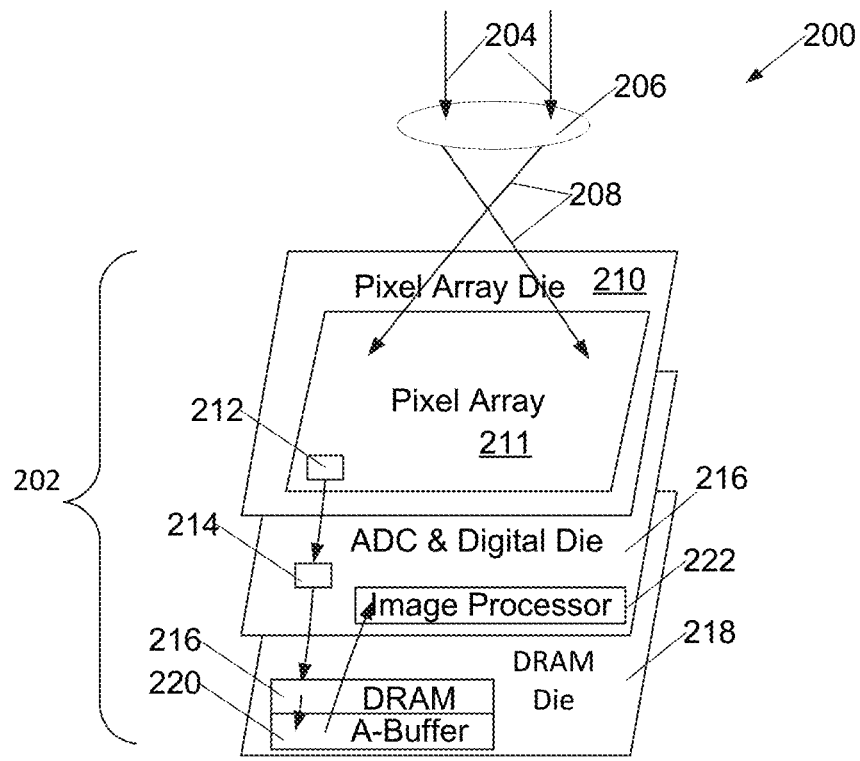
FIG. 1 is a diagram illustrating significant blocks of a camera having a three-wafer bond-per-pixel image sensor showing information flow between die and blocks.
Figure 2:
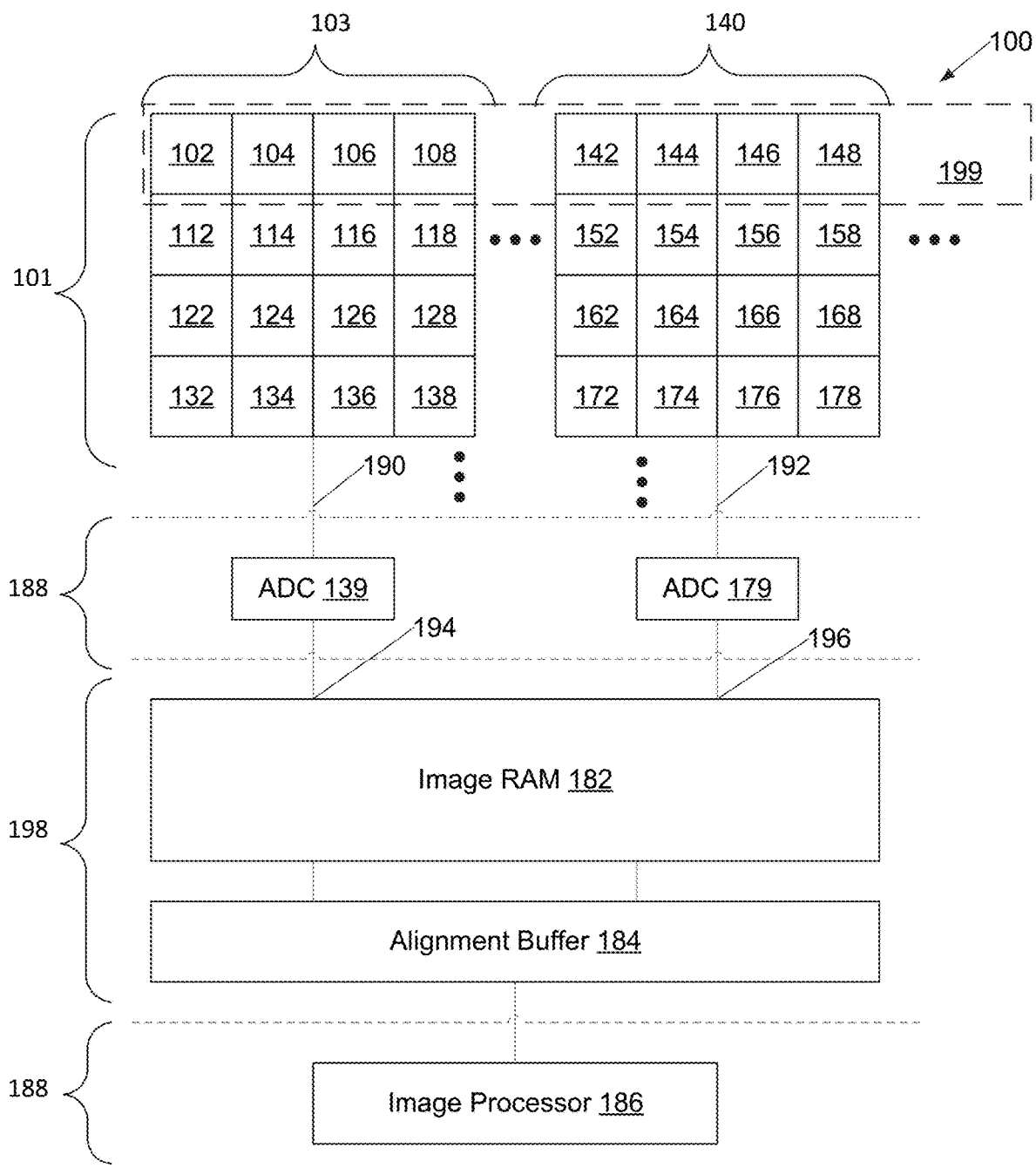
FIG. 2 is a block diagram of an image sensor with associated RAM image-buffer memory, alignment buffer, and image processor.

With reference to FIGS. 1 and 2, an electronic camera 200 having a three-wafer stacked, bond-per-pixel-block image sensor 100, 202 receives incoming light 204 through a lens 206 that focuses light 208 onto a pixel array die 210, or portion of a pixel array wafer, of image sensor 100, 202. This light interacts with photodiodes in blocks 212, 103, 140 of pixels of a pixel array 211 of pixel array die 210, 101. Each block 212, 103, 140 has multiple pixels, while sixteen pixels are illustrated in FIG. 2 for each block for simplicity, in example embodiments pixel counts per block may range from four to one hundred twenty-eight, and in a particular embodiment each block has sixty-four pixels. In an embodiment, pixel array die 210, 101 is a backside-illuminated photosensor die including photodiodes and pixel-selection transistors for each pixel within the block, each block having an inter-die bonding pad on a surface of the pixel array die coupled to a separate analog-to-digital converter (ADC) 139, 179, 214 of an ADC and Digital Die 188, 216, the ADC and Digital Die 188, 216 being a portion of a second wafer.

Each ADC 139, 179, 214 of ADC and Digital Die 188, 216 converts signals 190, 192 received from selected pixels of the associated block 212, 103, 140 into digital form, and provides that digital form through through-die vias and inter-die bonding pads 194, 196 to an image RAM 182, 216 on a RAM die 198, 218, the RAM die being a portion cut from a RAM wafer. In a particular embodiment, image RAM 182, 216 is implemented as dynamic RAM (DRAM). Image RAM 182, 216 is sized and configured to hold at least one image as digitized, in one embodiment it holds a single image and in another embodiment it holds a stack of multiple images.

Image RAM 182, 216 is configured to be read through an alignment buffer 184, 220 of RAM die 198, 218, the read-out data sent through inter-die bonding pads of the RAM die that are coupled to inter-die bonding pads and through-die vias of the ADC and Digital Die 188, 216, and thence to image processor 186, 222 of the ADC and Digital Die 188, 216.

In the sixteen-pixel per pixel block 103, 140 embodiment of FIG. 2, there are many rows and columns of pixel blocks, for example and not limitation a 20-megapixel camera array may have 5120×4096 pixels; in blocks of 16 pixels 1,310, 720 blocks in a 1280×1024 array of blocks. In an alternative embodiment using blocks of 64 pixels a similar-sized camera array may have 327,680 blocks in an array of 640×512 blocks.

In the embodiment of FIG. 2, pixels 102, 104, 106, 108 are adjacent pixels in block 103 and in the same pixel row 199 as pixels 142, 144, 146, 148 of block 140. Similarly, pixels 112, 114, 116, 118 are adjacent pixels in block 103 and in the same pixel row as pixels 152, 154, 156, 158 of block 140; pixels 122, 124, 126, 128 are adjacent pixels in block 103 and in the same pixel row as pixels 162, 164, 166, 168 of block 140; and pixels 132, 134, 136, 138 are adjacent pixels in block 103 and in the same pixel row as pixels 172, 174, 176, 178 of block 140.

Because the pixels in each block must be read sequentially through the ADC associated with that block, and are read in parallel with pixels of blocks of the same row of blocks, data from one pixel in each block of a row of blocks is entered into each effective word 183 of the image RAM 182.

Data from blocks 103, 140 of the pixel array of FIG. 2 is nonadjacent in image RAM 182, 300 as illustrated in FIG. 3. Each word 302 of the image buffer includes ADC results corresponding to pixel data of corresponding pixels in each block, such as blocks 103, 140, of a row of blocks 101, 304, 306. In a particular embodiment having an image sensor with 640×512 blocks, 64 pixels per block, having 640 blocks per block row, at 12 bits per ADC, the width of writes for a single block row may be 7680 bits. Since all 512 rows of a frame may write into the image RAM 182, the image RAM is written in 64 writes of 3,932,160 bits each, with each write including ADC data for a corresponding pixel of each block.

In an alternative embodiment, to reduce surge currents and noise, a subset of the blocks or a subset of the rows are written simultaneously, with a remaining rows or blocks written in immediately following write operations. For example, in one alternative embodiment, pixels associated with even-numbered block rows are written in a first write operation and pixels associated with odd-numbered block rows are written in a second write operation, reducing width of writes to 3840 bits. Similarly, pixels for even-numbered blocks in a row may be written simultaneously, with odd-numbered blocks written immediately thereafter in a second write operation, also reducing width of writes. In these embodiments, reading requires similar data-order rearrangement to that herein described.

The image RAM 182, 300 is read in words 302 each having ADC results for one pixel of a block and corresponding pixels within the same row. In a particular embodiment having an image sensor with 640×512 blocks, 64 pixels organized 8×8 pixels in each block, and a 12-bit ADC, the RAM image buffer is read as 4096 words of 7680 bits each. This provides a time sequence 308 of pixel data where pixel data jumps from block to block rather than from pixel to pixel in row sequence.

Alignment Buffer

Data as read from the image RAM 182, 300, does not come in a sequence 308 of pixel data, such as a sequence corresponding to pixels in each row, that is desired for image processor 186. We re-order this data in alignment buffer 184 so adjacent pixel data arrives at image processor 186 in a desired pixel sequence.

At times during image processing, our alignment buffer reorders adjacent pixels in a sequence corresponding to a left-to-right or a right-to-left scan of pixels in rows of pixels as illustrated in FIG. 4A or 4B, before providing this data to image processor 186.

In an embodiment, pixels are provided by the alignment buffer to the image processor in color cell groups of four adjacent pixels, two pixels from a first pixel row with two pixels from a second pixel row, pixel data for each color cell group being provided to the image processor simultaneously. The pixel data for color cell groups are provided to the image processor sequentially in a right to left or left to right scan order of color-cell groups. This color-cell group order simplifies color processing and edge detection in the image processor.

Figure 5:
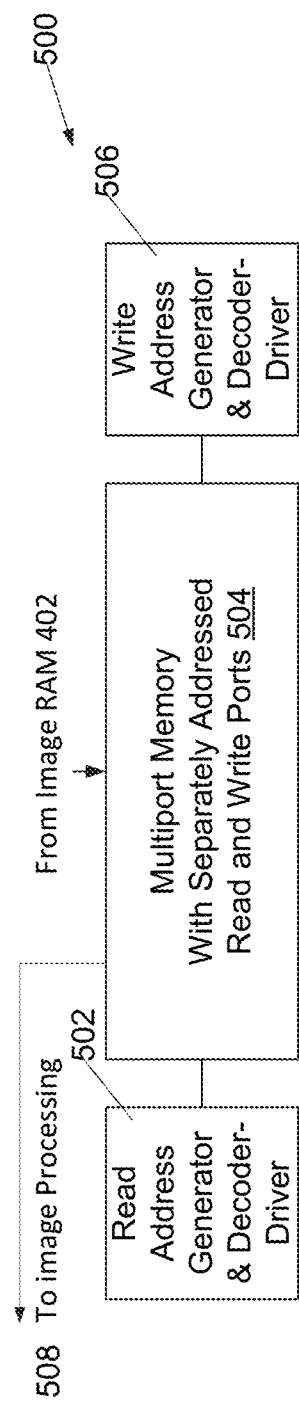
FIG. 5 is a block diagrams of an embodiment of an alignment buffer using a single, multiport, RAM for use in the sensor of FIG. 2 and adapted to change the data order of FIG. 3 to the data order of FIGS. 4A and 4B.
Figure 9:
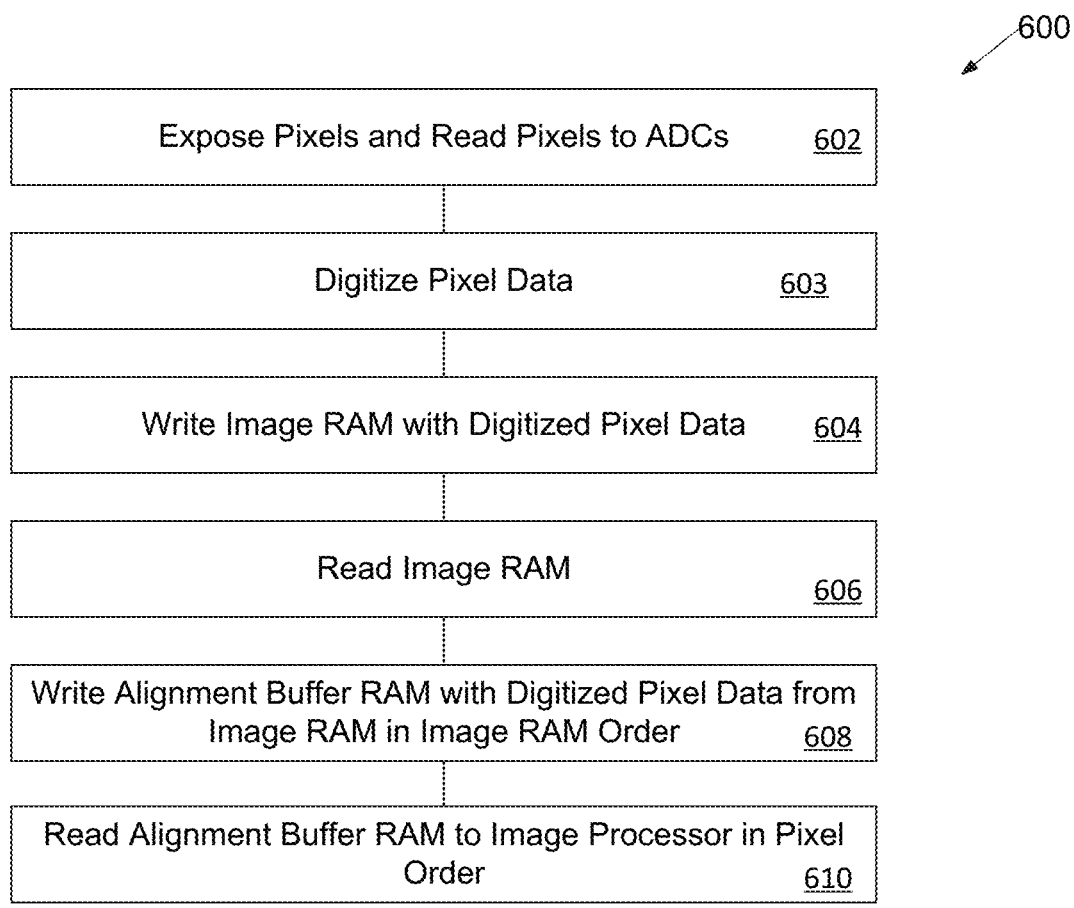
FIG. 9 is a flowchart of operation of the sensor of FIG. 2.

In an embodiment, as illustrated in FIG. 5, the realignment buffer 500 is implemented using a single high-speed, multiple-port alignment buffer RAM 504 supporting separate write and read addresses and separate data in and out busses, this RAM is capable of being written and read simultaneously at different addresses. In this embodiment, data from image RAM 402 is entered into cells of multiport alignment buffer RAM 504 at an address specified by write address generator 506, the write address generator corresponding to buffer write address generator 406. Data from multiport alignment buffer RAM is read and provided to the image processor 508 according to an address from read address generator 502, corresponding to buffer read address and enable generator To summarize, in operation, the camera and image sensor herein described operates 600 (FIG. 9) by first exposing 602 pixels of the pixel array die to light, then transferring analog pixel data in sequence for each pixel of each pixel block to an ADC on the ADC and logic die, where this data is digitized 603 to give digitized pixel data for each pixel, digitized pixel data forming a portion of digitized image data for a full frame image. The digitzed pixel data is written 604 to an image RAM in an order corresponding to an order of pixels within blocks, the image RAM adapted to store the digitized pixel data for at least one full image frame as digitized image data. The digitized image data is then read 606 into an alignment buffer and written 608 therein in Image RAM order.

Data is then read 610 from the alignment buffer and provided to an image processor in desired pixel order.

Figure 6:
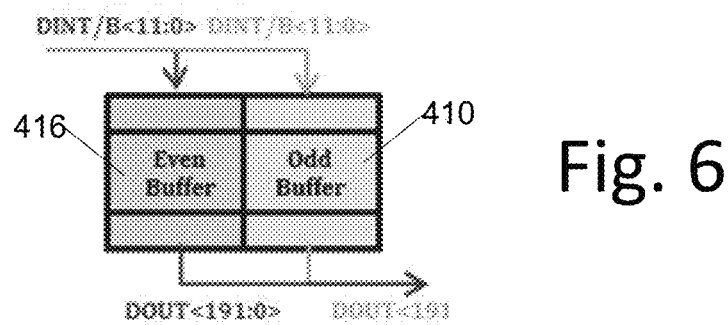
FIG. 6 illustrates a concept of a dual-RAM ping-pong alignment buffer.
Figure 6A:
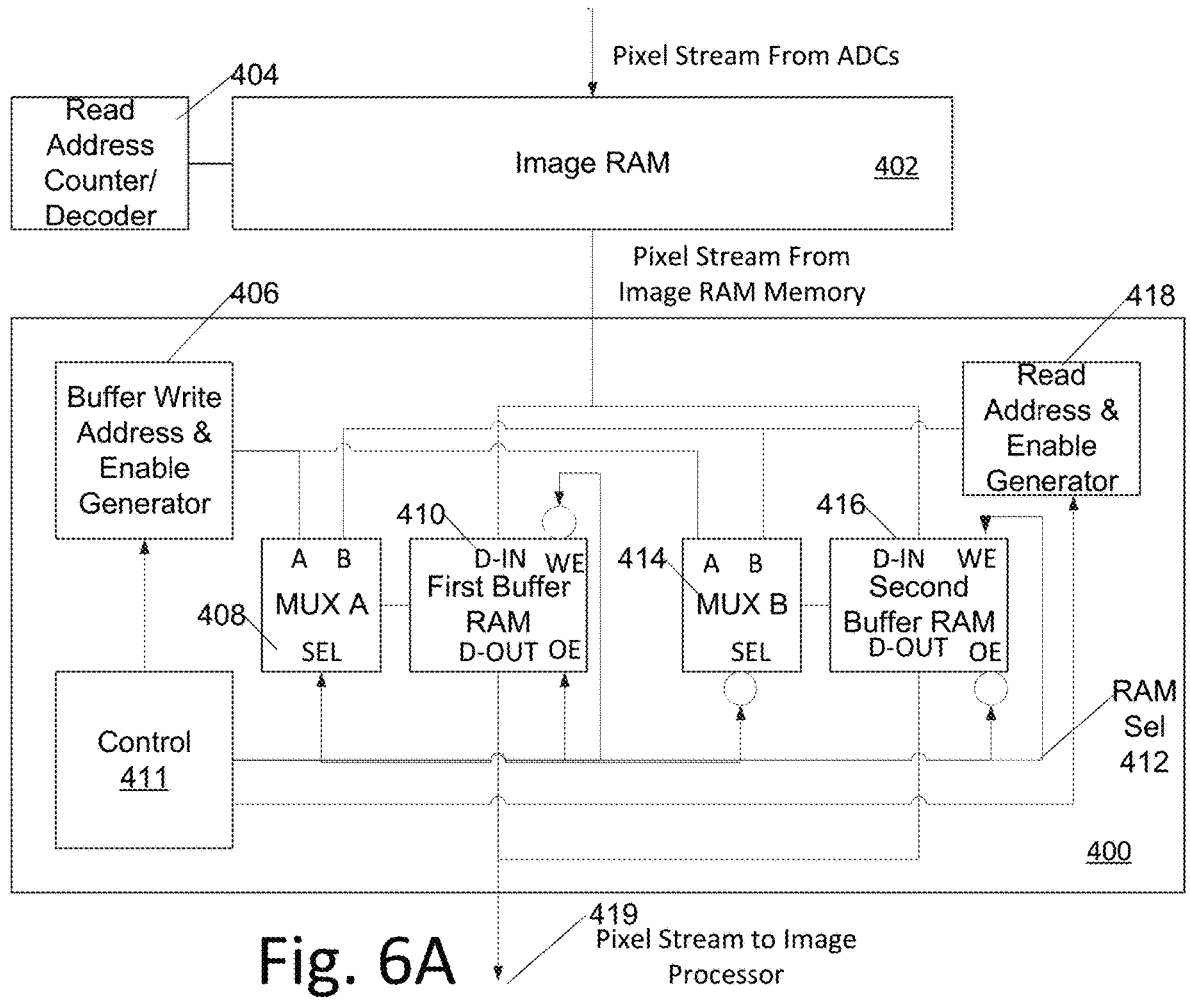
FIG. 6A is a block diagram of a dual-RAM alignment buffer for use in the sensor of FIG. 2 and adapted to change the data order of FIG. 3 to the data order of FIG. 4.

In a ping-pong RAM embodiment, alignment buffer 184, 400 (FIG. 6A receives a stream of pixel data from image RAM 402. In this embodiment, as illustrated in FIG. 6, two buffer RAMS 410, 416, are provided, with one buffer RAM being written while the other buffer RAM is being read, permitting operation with single-port buffer RAMs. In this embodiment, as read addresses counter 404 steps through each row of pixels, an alignment buffer write address counter 406 provides corresponding write addresses through a first address multiplexor 408 and to a first buffer RAM 410. Upon completing writing of image RAM 402 with words of data corresponding to pixels in their order within the image RAM into first buffer RAM 410, a RAM selection control line 412 from control logic 411 toggles, such that alignment buffer write address counter 406 provides write addresses through a second address multiplexor 414 and to a second buffer RAM 416 while writing all image RAM 402 words corresponding to a second row of pixels. Upon completing writing of all image RAM 402 words of data corresponding to pixels in their order within the second row of pixels into second buffer RAM 410, RAM selection control line 412 from control logic 411 toggles, such that alignment buffer write address counter 406 provides write addresses through first address multiplexor 406 again and to first buffer RAM 410 while writing all image RAM 402 words corresponding to another row of pixels; thereby alternating, or "ping-ponging" writes to the first and second buffer RAMs 410, 416.

While image RAM 402 data is being written to second buffer RAM 416, a read-address counter and read-enable generator 418 provides addresses through first address multiplexor 408 and to first buffer RAM 410, reading the first pixel row data from the first buffer RAM 410 in desired pixel order and provides this data as alignment buffer output 419. When image RAM 402 data reverts to being written to first buffer RAM 410, read-address counter and read-enable generator 418 provide addresses through second address multiplexor 414 and to second buffer RAM 416, reading the second pixel row data from second buffer RAM 416 in desired pixel order.

Figure 7:
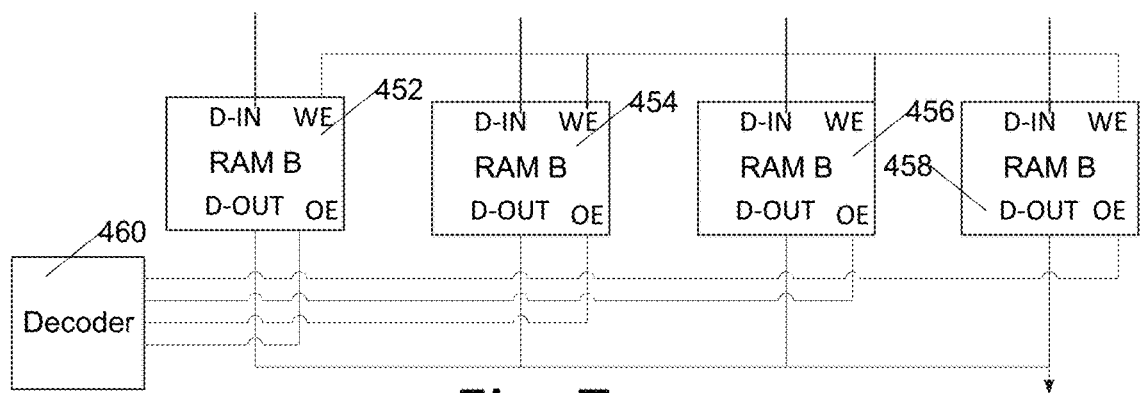
FIG. 7 is a block diagram of a RAM as used in the embodiment of FIG. 5.

Since in a particular embodiment, pixel data in one row are read from image RAM 402 and written to the alignment buffer in words incorporating pixels from every block of the row, yet read to the image processor in smaller chunks, each alignment buffer RAM 410, 416 is organized as multiple smaller RAMs 452, 454, 456, 458, as illustrated in FIG. 7, having outputs coupled in parallel and with output enables driven one at a time by a decoder 460. To prevent data overrun at the alignment buffer, changes to image RAM 402 address and writes to the alignment buffer RAMS 410, 416 may in some embodiments occur at a slower clock rate than changes of read address 418 and reading of buffer RAMS 410, 416.

The alignment buffer is readily reconfigurable between left-to-right and right-to-left sequential pixel output because read address generator 418 uses a selectable up-down counter, with the read address generator counting up pixels are read out in left to right order and with the read address generator counting down pixels are read out in right to left order.

The read and write address counters for the alignment buffer need not count sequentially, rather the read address counter counts in a desired pixel order.

The alignment buffer and image RAM as herein described is also readily reconfigurable from full resolution to reduced resolution, reduced bandwidth, modes. Reduced resolution modes are useful when using a high-resolution image sensor—such as is useful for high-resolution still photography—to provide viewfinder images or high-speed reduced-resolution video.

In a full resolution configuration, the alignment buffer read address counter is incremented or decremented by one at each read operation so all image RAM locations, and thus all pixels are read. In this embodiment, a read address counter 404, used to read the image RAM, is incremented or decremented by one so all rows of pixel data are read from the image RAM.

In a reduced resolution embodiment, reduced-resolution image data is read by skipping pixels in the image RAM by incrementing read address counter 404 by one to read pixel data from the alignment buffer that corresponds to pixels of a color group 802 (FIG. 8) near a first location of the pixel array die, then by a non-unity integer, such as in some configurations two or four, to skip to an alignment buffer address containing pixel data associated with a color group 804 near a second location of the pixel array die during reading of pixel row data into the alignment buffer. In this embodiment, read address counter 404, used to read the image RAM, is incremented or decremented by one to read adjacent pixel color data for rows associated with pixels of a color cell, then by a non-unity integer to skip one or more rows of pixel data in the image RAM, resulting in one or more rows of pixel data being skipped as pixel data is read from image RAM into the alignment buffer. The result is that some pixels, such as pixel data associated with crosshatched pixels in FIG. 8, being ignored as either unread from the image RAM or unread from the alignment buffer.

Figure 8:
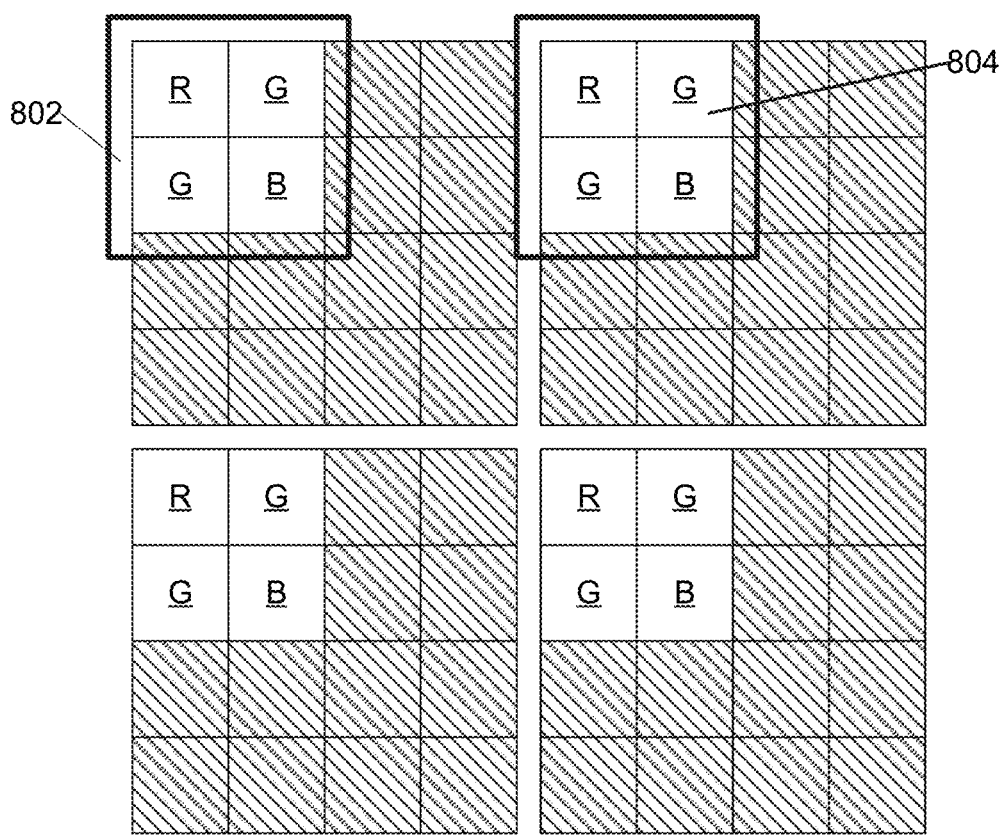
FIG. 8 is an illustration of pixels of color groups read from the image RAM and alignment buffer when the image sensor is operated at reduced resolution.

While FIG. 8 illustrates R-G-G-B (Red, Green, Green, Blue) Bayer-pattern pixel color groups, the system herein described is operable with other types of pixel color groups such as but not limited to R-G-W-B (Red, Green, White, Blue), or R-G-I-B (Red, Green, Infrared, Blue) color groups.

In addition to being configurable for reading at reduced resolution, the image sensor is configurable to be read at reduced bandwidth by adjustment of a clock associated with incrementing or decrementing the image RAM read address counter 404, alignment buffer read 418 and write 406 address counters, and other alignment buffer circuitry.

Combinations

The features herein described may be combined in multiple ways. Among combinations particularly anticipated by the inventors are:

An image sensor designated A having an array of pixels configured to sense light and configured in a plurality of blocks; where each block of pixels coupled to a separate analog-to-digital converter (ADC) adapted to provide digitized image data; the ADCs being coupled to feed digitized image data into an image RAM; and the image RAM being coupled to provide digitized image data to an alignment buffer in a first pixel order. The alignment buffer is configured to provide digitized image data to an image processor in a second pixel order, different from the first pixel order.

An image sensor designated AA including the image sensor designated A wherein the array of pixels, the ADCs, and the image RAM are each physically located on a separate die, the separate dies interconnected by inter-die bonds.

An image sensor designated AB including the image sensor designated A or AA wherein the alignment buffer comprises a multiport RAM capable of being read at a first address and written at a second address simultaneously, the first address being different from the second address.

An image sensor designated AC including the image sensor designated A or AA wherein the alignment buffer has a first and a second alignment buffer RAM, the alignment buffer being configured to write the first alignment buffer RAM with digitized image data while the second alignment buffer RAM is read to provide digitized image data to the image processor, and to write the second alignment buffer RAM with digitized image data while the first alignment buffer RAM is read to provide digitized image data to the image processor.

An image sensor designated AD including the image sensor designated AB or AC where the image RAM is DRAM and adapted to store at least an entire image frame.

An image sensor designated AE including the image sensor designated AB, or AC where the alignment buffer is reconfigurable to provide the digitized image data to the image processor in an order selectable between a left-to-right pixel order and a right-to-left pixel order.

An image sensor designated AF including the image sensor designated A, AA, AB, AC, or AD where the alignment buffer and image RAM are configurable to reduce resolution and/or bandwidth of digitized image data.

An image sensor designated AG including the image sensor designated AB, AC, AD, AE, or AF wherein the alignment buffer is configured to be written in words of a first length and to be read in words of a second length shorter than the first length.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. An image sensor comprising:
    an array of pixels configured to sense light and configured in a plurality of blocks;
    where each block of pixels is coupled to a separate analog-to-digital converter (ADC) adapted to provide digitized image data;
    the ADCs being coupled to feed digitized image data into an image RAM; and
    the image RAM is coupled to provide digitized image data to an alignment buffer in a first pixel order;
    where the alignment buffer is configured to provide digitized image data to an image processor in a second pixel order, the second pixel order different from the first pixel order, the array of pixels, and the image processor are each physically located on a separate die, in a stacked-die assembly the separate die being interconnected by die-to-die bonds;
    wherein the array of pixels, the ADCs, and the image RAM are each physically located on separate die of the stacked-die assembly;
    and wherein the image processor is located on the same die as the ADCs.

2. The image sensor of claim 1 wherein the alignment buffer comprises a multiport RAM capable of being read at a first address and written at a second address simultaneously, the first address being different from the second address.

3. An image sensor comprising:
    an array of pixels configured to sense light and configured in a plurality of blocks;
    where each block of pixels is coupled to a separate analog-to-digital converter (ADC) adapted to provide digitized image data;
    the ADCs being coupled to feed digitized image data into an image RAM; and
    the image RAM is coupled to provide digitized image data to an alignment buffer in a first pixel order;
    where the array of pixels, the ADCs, and the image RAM are each physically located on a separate die, the separate die being interconnected by die-to-die bonds;
    where the alignment buffer is configured to provide digitized image data to an image processor in a second pixel order, the second pixel order different from the first pixel order;
    wherein the alignment buffer comprises a multiport RAM capable of being read at a first address and written at a second address simultaneously, the first address being different from the second address; and
    wherein the multiport RAM is configured to be written in words of a first length and to be read in words of a second length shorter than the first length.

4. The image sensor of claim 3 wherein the second pixel order is configurable to at least a left-to-right and a right-to-left pixel order.

5. The image sensor of claim 4 wherein the second pixel order is configurable to at least a full resolution pixel order and to a reduced resolution pixel order.

6. The image sensor of claim 5 wherein the image RAM is DRAM and is adapted to store at least one entire image frame.

7. The image sensor of claim 3 wherein the alignment buffer comprises a first and a second alignment buffer RAM, the alignment buffer being configured to write the first alignment buffer RAM with digitized image data while the second alignment buffer RAM is read to provide digitized image data to the image processor, and to write the second alignment buffer RAM with digitized image data while the first alignment buffer RAM is read to provide digitized image data to the image processor.

8. The image sensor of claim 7 wherein the image RAM is DRAM and is adapted to store at least one entire image frame.

9. The image sensor of claim 8 wherein the alignment buffer is reconfigurable to provide the digitized image data to the image processor in an order selectable from at least a left-to-right pixel order and a right-to-left pixel order.

10. The image sensor of claim 9 wherein the multiport RAM is configured to be written in words of a first length and to be read in words of a second length shorter than the first length.

11. The image sensor of claim 10 wherein the alignment buffer is configurable to provide digitized image data to the image processor in a full resolution order and in a reduced resolution order.

12. A method of providing image data to an image processor in a multiple-stacked-wafer image sensor, the image sensor having a pixel sensor die having pixels organized as blocks of pixels, comprising:
    repetitively reading pixel data from a pixel in each block of pixels through an analog-to-digital converter (ADC) to generate digitized pixel data and simultaneously writing the digitized pixel data for the pixel in each block into an image RAM until all pixels in each block are read;
    reading the digitized pixel data from the image RAM located on a separate wafer from the ADC into an alignment buffer, the pixel data being in a first pixel order in the image RAM; and
    reading the digitized pixel data from the alignment buffer into an image processor in a second pixel order;
    the image processor the image processor being located on the same wafer as the ADCs and on a different wafer than the pixel array.

13. The method of claim 12 wherein the second pixel order provides digitized pixel data of pixels of color cells to the image processor in color cell groups.

* * * * *